(12) United States Patent
Lou et al.

(10) Patent No.: US 7,102,419 B2
(45) Date of Patent: Sep. 5, 2006

(54) BIAS GENERATOR THAT AUTOMATICALLY ADJUSTS ITS SLEW RATE

(75) Inventors: Chih-Hong Lou, Hsinchu (TW); Yen-Jen Liu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 38 days.

(21) Appl. No.: 11/080,514

(22) Filed: Mar. 16, 2005

(65) Prior Publication Data

US 2006/0132217 A1    Jun. 22, 2006

(30) Foreign Application Priority Data

Dec. 20, 2004    (TW) ............................... 93139611 A

(51) Int. Cl.
*G11C 5/14*    (2006.01)
(52) U.S. Cl. .................. 327/530; 327/540; 327/545
(58) Field of Classification Search ................ 327/530, 327/538, 540, 541, 545; 323/316, 115
See application file for complete search history.

(56) References Cited

U.S. PATENT DOCUMENTS 5,859,560 A * 1/1999 Matthews ................... 327/513
6,118,330 A * 9/2000 Bossard ...................... 327/540

* cited by examiner

*Primary Examiner*—Quan Tra
*Assistant Examiner*—Khareem E. Almo
(74) *Attorney, Agent, or Firm*—Rabin & Berdo, P.C.

(57) ABSTRACT

A bias generator that automatically adjusts its slew rate is disclosed to generate an output bias current and adjust the output bias current according to the frequency of a clock signal. The slew rate of the amplifier is thus controlled to save power. It includes: a current mirror for receiving a feedback voltage and generating an output bias current; a storage capacitor with a first end and a second end and the latter being coupled to the ground; a charging switch coupled between the output of the current mirror and the first end of the storage capacitor; a discharging switch coupled between the first end of the storage capacitor and the ground; a comparator whose input is coupled to the first end of the storage capacitor and a reference voltage; and a feedback unit coupled to the output of the comparator for outputting a feedback voltage to the current mirror.

6 Claims, 6 Drawing Sheets

BIAS GENERATOR THAT AUTOMATICALLY ADJUSTS ITS SLEW RATE

BACKGROUND OF THE INVENTION

1. Field of Invention

The invention relates to a bias generator and, in particular, to a bias generator that automatically adjusts its slew rate.

2. Related Art

A unit gain buffer in the prior art shown in FIG. 1 includes an amplifier and a feedback circuit. The amplifier has a positive input end, a negative input end, and an output end. The positive input end is coupled to an input voltage Vin, the negative input end is coupled to the output end to obtain an output voltage Vout.

FIG. 2 shows the comparison between the input voltage and the output voltage of the unit gain buffer in the prior art. Its gain is one, meaning that the output voltage is equal to the input voltage theoretically. In practice, the input voltage is a step voltage. The uprising slope of the output voltage is not infinite. Therefore, it takes certain time T1 to reach a stable ratio. This period of time T1 is called the slew time. After the conversion stage, the increase of the output voltage becomes less significant. It takes some time T2 to settle. This period of time is called the settling time.

The slew rate SR is the uprising slope of the output voltage Vout with respect to time during the slew time. The slew rate SR is obtained by taking the derivative of the output voltage Vout with respect to time:

$$SR = d\text{Vout}/dt.$$

To perform sampling and holding actions, the pipeline analog analog-to-digital converter (ADC) has to wait for the slew time and the settling time before obtaining a fixed voltage.

FIG. 3 shows a conventional differential amplifier and its input voltage and output voltage. The input voltage Vin of the differential amplifier is a step voltage. When the input voltage Vin is small, the output voltage Vout changes with the step height of the input voltage. If the input voltage Vin becomes too large, the control switch M2 of the differential amplifier shuts down. The output voltage Vout depends only on a tail current Iss and a load capacitance CL:

$$SR = \text{Iss}/\text{CL}.$$

Since the differential amplifier in the prior art has a fixed slew rate, there often are problems in over designs and power waste.

Take a differential amplifier operating between 20 MHz and 60MHz as an example. One often uses the highest frequency 60 MHz to design the optimal value of the slew rate. For low-frequency signals of 20 MHz or 40 MHz, the high slew rate cannot increase the reaction efficiency and simply wastes power.

SUMMARY OF THE INVENTION

In view of the foregoing, the invention provides a bias generator that automatically adjusts its slew rate.

An objective of the invention is to provide a bias generator that automatically adjusts its slew rate for generating an output bias current and adjusting the magnitude of the output voltage according to the frequency of a clock signal. The slew rate of an amplifier is controlled to save power.

The disclosed bias generator includes: a current mirror, a storage capacitor, a charging switch, a discharging switch, a comparator, and a feedback unit. The current mirror receives a feedback voltage and outputs an adjustable current. The storage capacitor has a first end and a second end, with the latter being coupled to the ground. The charging switch is coupled between the output of the current mirror and the first end of the storage capacitor. The discharging switch is coupled between the first end of the storage capacitor and the ground. The comparator has its input connected to the first end of the storage capacitor and a reference voltage. The feedback unit is coupled to the output of the comparator and outputs the feedback voltage to the current mirror via a low pass filter. The charging switch and the discharging switch are controlled by a clock signal. When the charging switch turns on, the discharging switch shuts off. The current mirror charges the storage capacitor. When the charging switch shuts off, the discharging switch turns on. The storage capacitor thus discharges.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
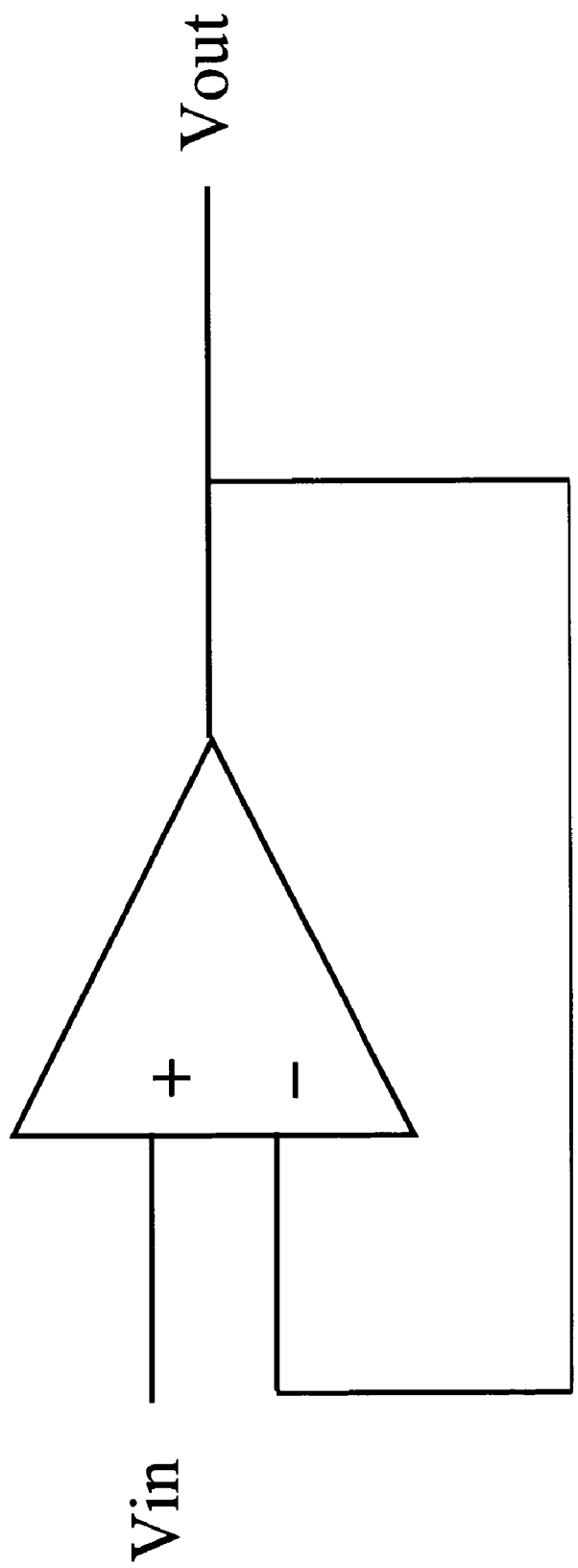
FIG. 1 is a unit gain buffer in the prior art.
Figure 2:
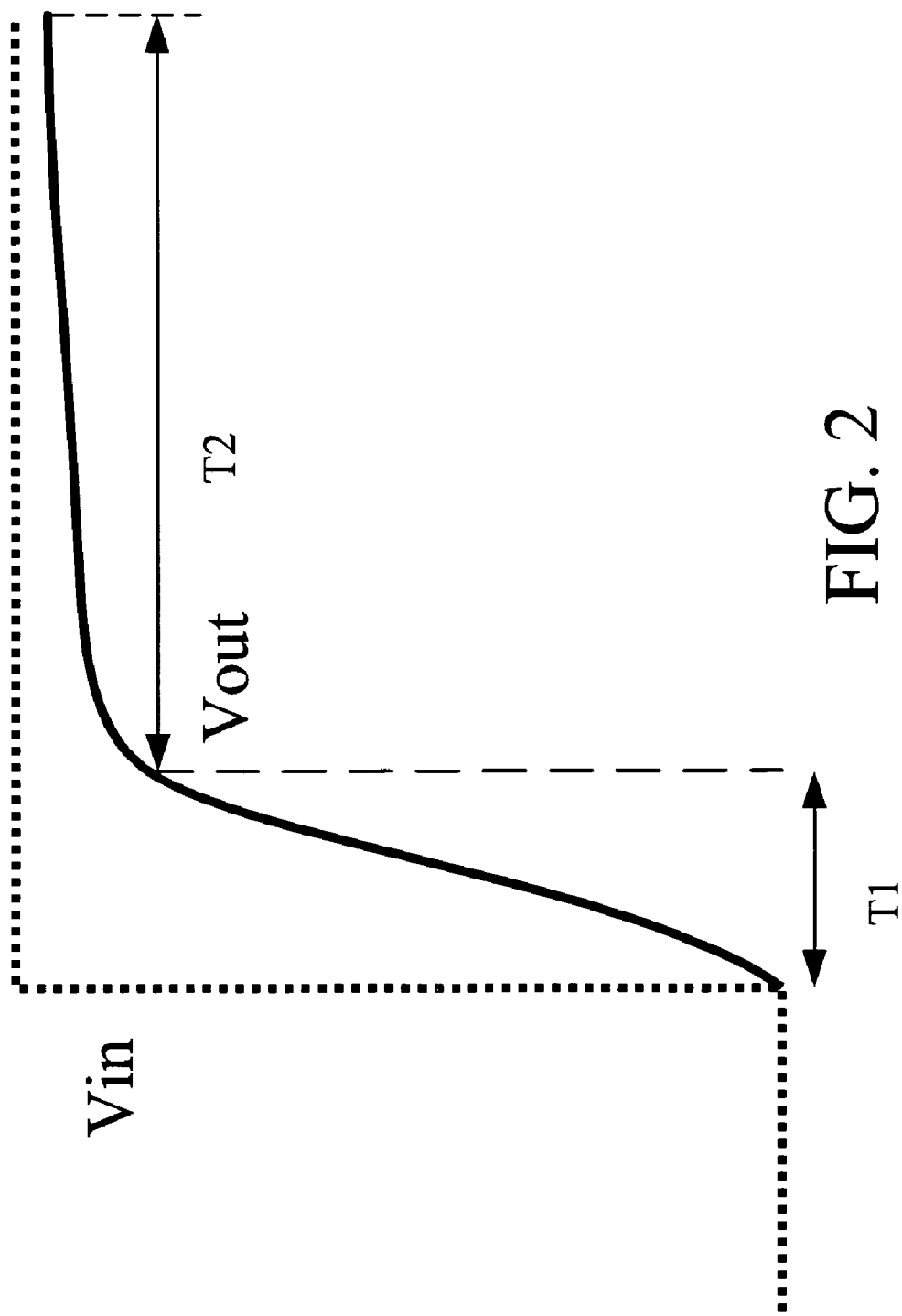
FIG. 2 compares the input and output voltages of a unit gain buffer in the prior art.
Figure 3:
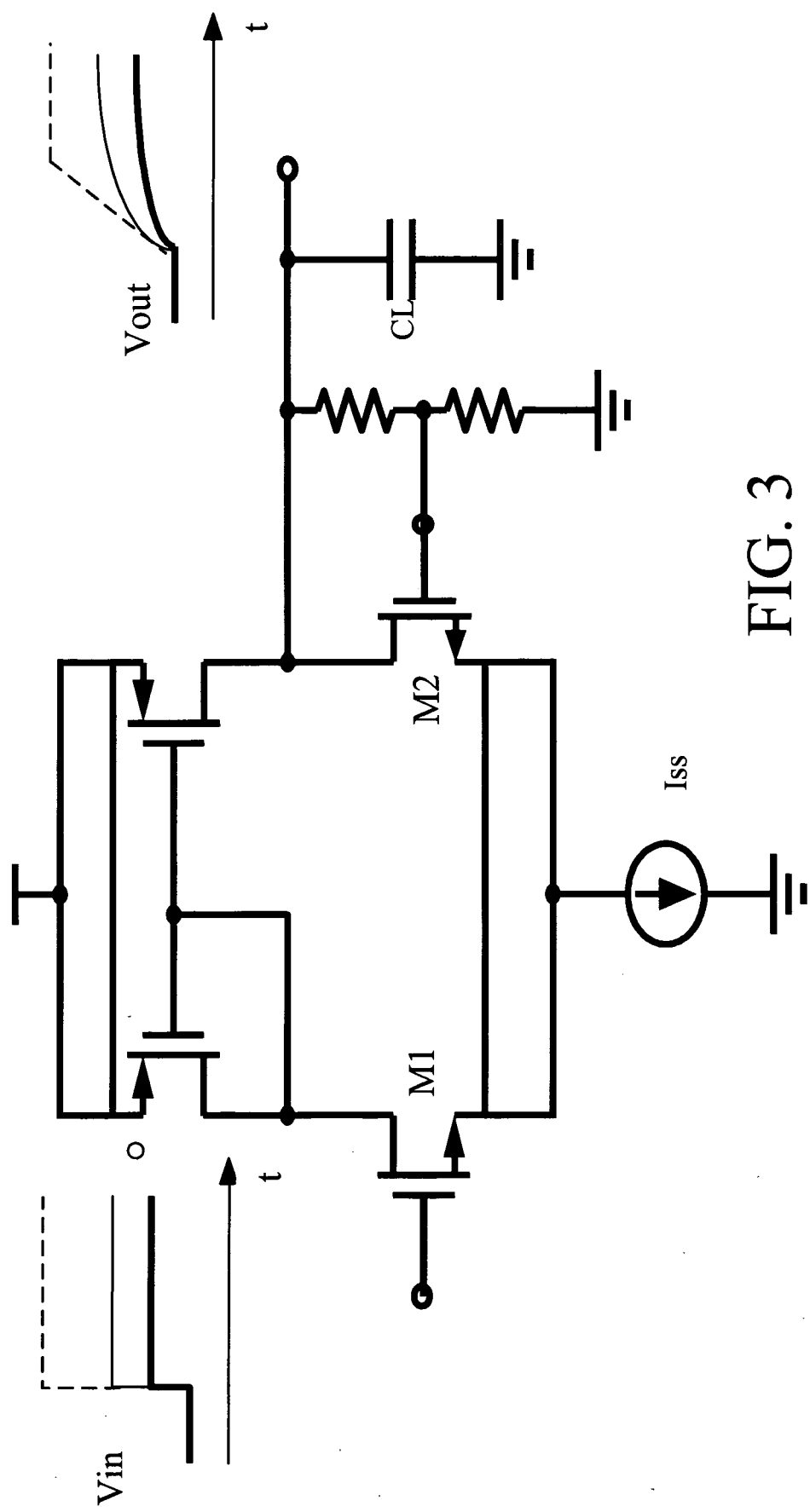
FIG. 3 shows a differential amplifier along with its input and output voltages in the prior art.
Figure 4:
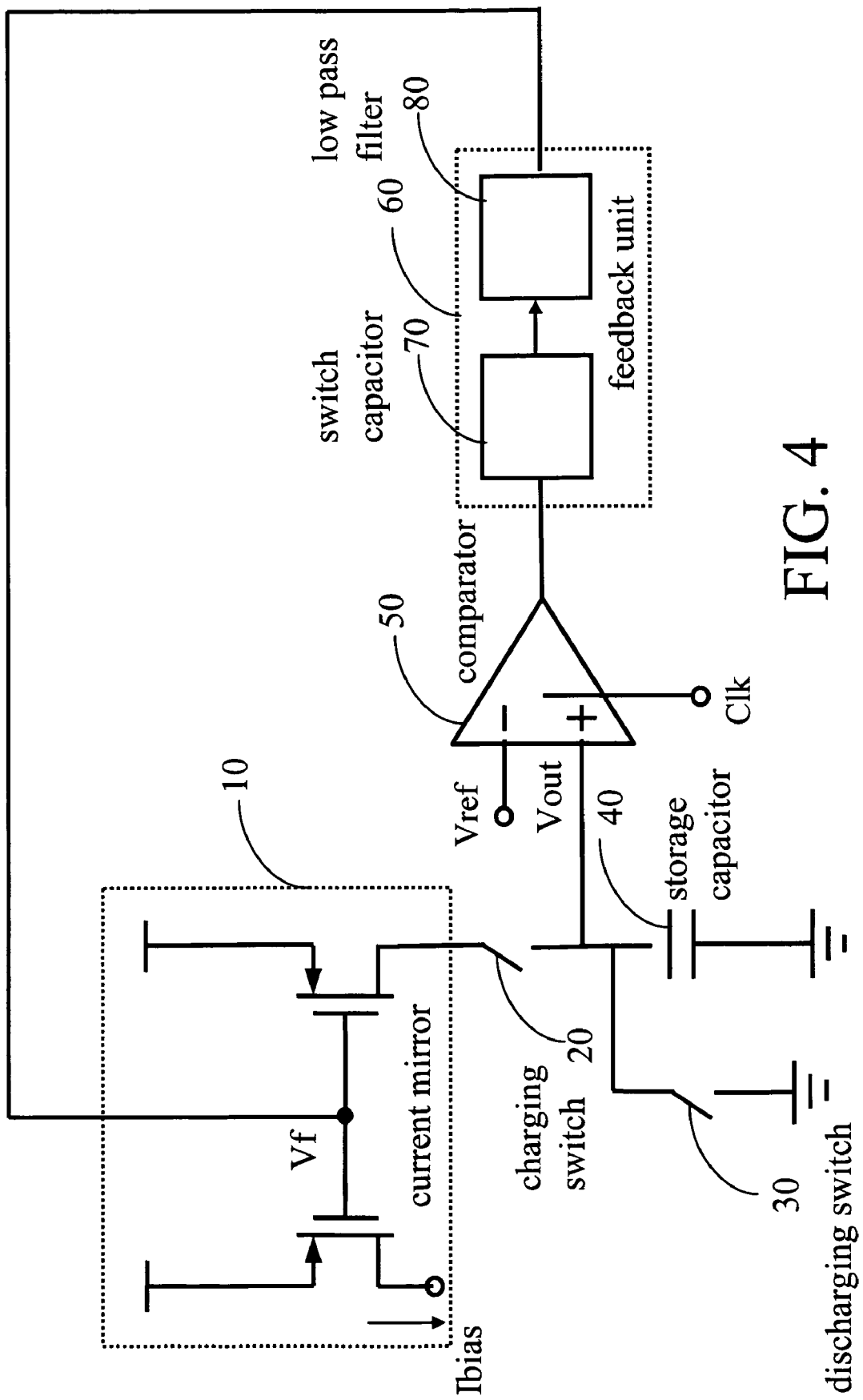
FIG. 4 shows an embodiment of the invention.

FIG. 4 shows an embodiment of the disclosed bias generator that automatically adjusts its slew rate. It contains: a current mirror 10, a storage capacitor 40, a charging switch 20, a discharging switch 30, a comparator 50, and a feedback unit 60.

The current mirror 10 receives a feedback voltage Vf and generates an output bias current Ibias. The current mirror 10 contains two PMOS transistors M1 and M2 or two NMOS transistors M1 and M2.

The storage capacitor 40 has a first end and a second end. The first end is coupled to the current mirror 10 or the ground under the control of the charging switch 20 and the discharging switch 30.

The charging switch 20 is coupled between the input of the current mirror 10 and the first end of the storage capacitor 40. The discharging switch 30 is coupled between the first end of the storage capacitor 40 and the ground.

The comparator 50 has a positive input end, a negative input end, and an output end. The positive input end is coupled to the first end of the storage capacitor. The negative input end is coupled to a reference voltage Vref.

The feedback unit 60 is coupled to the output end of the comparator 50 to output the feedback voltage to the current mirror 10. It contains a switch capacitor 70 and a low pass filter 80. The switch capacitor 70 is coupled to the output of the comparator. The low pass filter 80 is coupled to the switch capacitor 70.

The charging switch 20 and the discharging switch 30 are controlled by a clock signal. When the charging switch 20 turns on, the discharging switch 3 turns off. The current mirror 10 charges the storage capacitor 40. The comparator 50 compares the voltage Vout of the storage capacitor 40 with the reference voltage Vref. It changes the feedback voltage Vf via the feedback unit 60, thereby adjusting the current flowing toward the storage capacitor 40. When the clock signal CK has a high frequency, the charging speed of the storage capacitor 40 is faster and so is the slew rate. When the clock signal CK has a low frequency, the charging speed of the storage capacitor 40 is slower and so is the slew rate.

When the charging switch 20 turns off, the discharging switch 3 turns on. The storage capacitor discharges.

The feedback unit 60 is coupled to the output of the comparator 50 to output the feedback voltage Vf to the current mirror 10. The feedback voltage Vf is coupled to the gates of the transistors M1, M2 in the current mirror 10. The current mirror 10 then controls the tail current and the slew rate of the amplifier.

Figure 5:
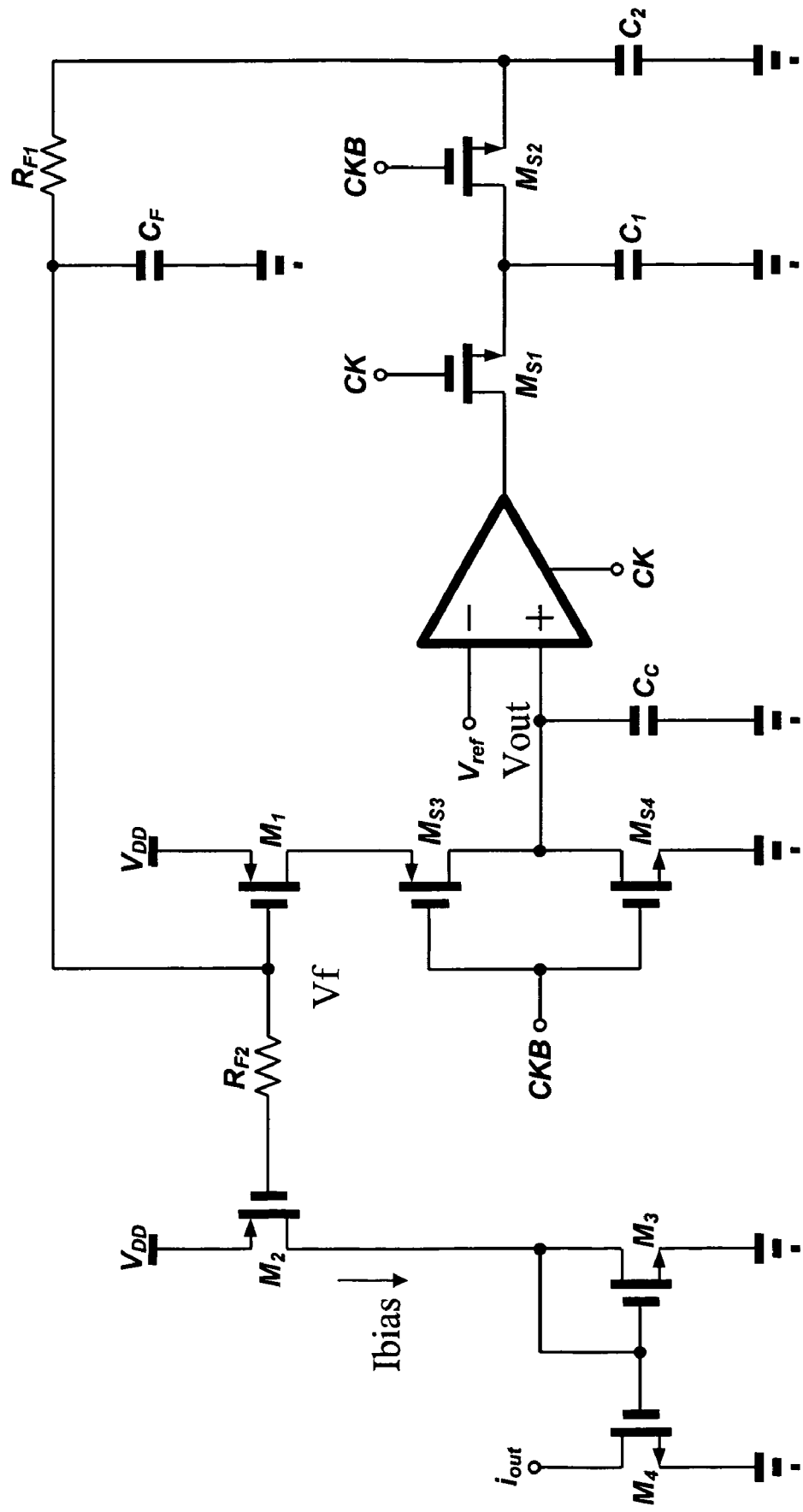
FIG. 5 shows a circuit diagram of the embodiment in FIG. 4.

With reference to FIG. 5, the circuit diagram of this embodiment, the switch capacitor 70 contains: a first switch Ms1, a first capacitor C1, a second switch Ms2, and a second capacitor C2. The first switch Ms1 is coupled to the output of the comparator 50. The first capacitor C1 is coupled between the output of the first switch Ms1 and the ground. The second switch Ms2 is coupled to the output of the first switch Ms1. The second capacitor C2 is coupled between the output of the second switch Ms2 and the ground.

When the clock signal CK is at a high level, the first switch Ms1 is on and the second switch Ms2 is off. The first capacitor C1 is charged to store charges.

When the clock signal CK is at a low level, the first switch Ms1 is off and the second switch Ms2 is on. The first capacitor C1 discharges to the second capacitor C2, achieving charge sharing between the first capacitor C1 and the second capacitor C2.

The low pass filter 80 contains a filter resistor RF1 and a filter capacitor CF. The filter resistor RF1 is coupled to the switch capacitor 40. The filter capacitor CF is coupled between the filter resistor RF1 and the ground.

Figure 6:
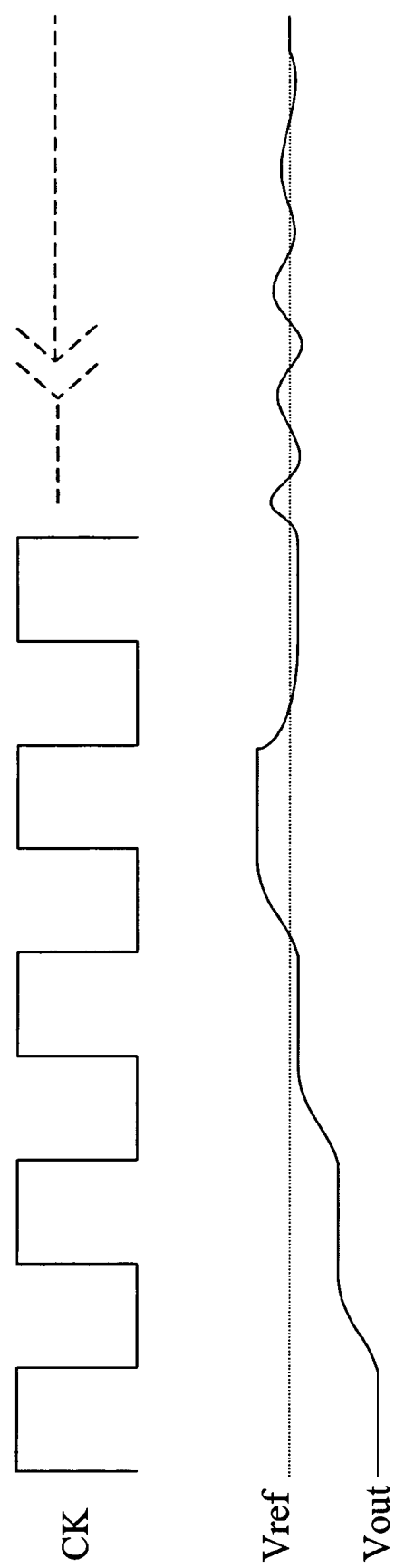
FIG. 6 shows the waveforms of the reference voltage, the output voltage, and the clock signal.

The waveforms of the reference voltage, the output voltage, and the clock signal are shown in FIG. 6. When the clock signal CK is at a high level, the charging switch 20 is on and the discharging switch 30 is off. The current mirror 10 charges the storage capacitor 40. The comparator 50 compares the voltage of the storage capacitor Vout and the reference voltage Vref. The charging speed depends on the frequency of the clock signal CK.

The disclosed bias generator generates an output bias current and adjusts it according to the frequency of a clock signal. The slew rate of the amplifier is controlled to avoid over designs and to save power.

Certain variations would be apparent to those skilled in the art, which variations are considered within the spirit and scope of the claimed invention.

What is claimed is:

1. A bias generator that automatically adjusts its slew rate for generating an output bias current and adjusting the output bias current according to the frequency of a clock signal, comprising:
    a current mirror, which receives a feedback voltage and generates the output bias current;
    a storage capacitor, which has a first end and a second end, said second end is coupled to the ground;
    a charging switch, which is coupled between the output of the current mirror and the first end of the storage capacitor;
    a discharging switch, which is coupled between the first end of the storage capacitor and the ground;
    a comparator, whose input is coupled to the first end of the storage capacitor and a reference voltage; and
    a feedback unit, which is coupled to the output of the comparator for outputting the feedback voltage to the current mirror;
    wherein the charging switch and the discharging switch are controlled by the clock signal; when the charging switch is on and the discharging switch is off, the current mirror charges the storage capacitor; and when the charging switch is off and the discharging switch is on, the storage capacitor discharges.

2. The bias generator of claim 1, wherein the current mirror includes two PMOS transistors.

3. The bias generator of claim 1, wherein the current mirror includes two NMOS transistors.

4. The bias generator of claim 1, wherein the feedback unit includes:
    an switch capacitor, which is coupled to the output of the comparator; and
    a low pass filter, which is coupled to the switch capacitor.

5. The bias generator of claim 4, wherein the switch capacitor includes:
    a first switch, which is coupled to the output of the comparator;
    a first capacitor, which is coupled between the output of the first switch and the ground;
    a second switch, which is coupled to the output of the first switch; and
    a second capacitor, which is coupled between the output of the second switch and the ground;
    wherein when the clock signal is at a high level the first switch is on, the second switch is off, and the first capacitor charges, and when the clock signal is at a low level the first switch is off, the second switch is on, and the first capacitor discharges to the second capacitor.

6. The bias generator of claim 4, wherein the low pass filter includes:
    a filter resistor, which is coupled to the switch capacitor; and
    a filter capacitor, which is coupled between the filter resistor and the ground.

* * * * *